United States Patent
Wu

(10) Patent No.: US 6,806,107 B1
(45) Date of Patent: Oct. 19, 2004

(54) ELECTRICAL FUSE ELEMENT TEST STRUCTURE AND METHOD

(75) Inventor: Shien-Yang Wu, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/431,821

(22) Filed: May 8, 2003

(51) Int. Cl.[7] .......................... G01R 31/26; H01L 21/66; H01L 23/58; G01N 27/00
(52) U.S. Cl. .......................... 438/18; 438/132; 438/601; 257/48; 257/529; 324/71.1; 324/765
(58) Field of Search ........................ 438/18, 132, 601; 257/48, 529; 324/550, 765–769, 71.1

(56) References Cited

U.S. PATENT DOCUMENTS

| | | | |
|---|---|---|---|
| 4,698,589 A | * 10/1987 | Blankenship et al. | 365/201 |
| 4,796,075 A | 1/1989 | Whitten | |
| 5,381,034 A | * 1/1995 | Thrower et al. | 257/529 |
| 5,493,148 A | * 2/1996 | Ohata et al. | 257/538 |
| 5,952,838 A | * 9/1999 | Tikhonov | 324/754 |
| 6,232,150 B1 | * 5/2001 | Lin et al. | 438/119 |
| 6,242,790 B1 | 6/2001 | Tsui et al. | |
| 6,271,574 B1 | 8/2001 | Delpech et al. | |
| 6,275,058 B1 | * 8/2001 | Lunde et al. | 324/765 |
| 6,312,964 B1 | * 11/2001 | Moyal | 438/18 |
| 6,424,161 B2 | * 7/2002 | Damon et al. | 324/550 |
| 6,436,738 B1 | 8/2002 | Yu | |
| 6,472,897 B1 | * 10/2002 | Shyr et al. | 324/765 |
| 2002/0038902 A1 | * 4/2002 | Naiki | 257/529 |

FOREIGN PATENT DOCUMENTS

| | | | | |
|---|---|---|---|---|
| DE | 1815617 B | * 4/1978 | | H02H/5/04 |
| JP | 08258622 A | * 10/1996 | | B60Q/11/00 |

* cited by examiner

Primary Examiner—John F. Niebling
Assistant Examiner—Jennifer M. Kennedy

(57) ABSTRACT

A method of monitoring heat dissipation behavior of a fuse element formed in an integrated circuit structure is provided. A fuse element is fabricated in an integrated circuit structure. A plurality of resistors are formed adjacent the fuse element, wherein a resistivity of the resistors is temperature dependent. The fuse element is triggered, whereby heat is dissipated into the integrated circuit structure. A resistance change in the resistors is monitored to determine the heat dissipation behavior of the fuse element during triggering.

26 Claims, 2 Drawing Sheets

ELECTRICAL FUSE ELEMENT TEST STRUCTURE AND METHOD

FIELD OF THE INVENTION

The present invention relates generally to integrated circuit fuse structures, and more particularly to methods and systems for testing integrated circuit fuse element structure.

BACKGROUND OF THE INVENTION

Electrical fuses, particularly silicided and non-silicided polysilicon fuses, have been widely adopted in integrated circuit fabrication over conventional metal fuses because of their package level reparability, field programming abilities, and built in self-test/self-repair abilities. Fuse elements are commonly utilized in field programmable, custom logic integrated circuits, such as programmable read-only memory (PROM) and programmable logic array circuits.

In the case of silicided polysilicon fuse elements, programming occurs by applying a voltage or current stress that results in a temperature high enough to cause agglomeration of the silicided layer. Little is known, however, about the thermal gradient or behavior of the fuse element with respect to its integrated circuit environment during programming. Currently, the thermal effect of programming cannot be understood without time consuming and extensive physical examinations, such as top view SEM (scanning electron microscopy) and cross-sectional SEM/TEM (transmission electron microscopy) analysis.

Therefore, a new method and system of determining the thermal behavior of a fuse element during programming are desired.

SUMMARY OF THE INVENTION

A method of monitoring heat dissipation behavior of a fuse element formed in an integrated circuit structure is provided. A fuse element is fabricated in an integrated circuit structure. A plurality of resistors are formed adjacent the fuse element, wherein a resistivity of the resistors is temperature dependent. The fuse element is triggered, whereby heat is dissipated into the integrated circuit structure. A resistance change in the resistors is monitored to determine the heat dissipation behavior of the fuse element during triggering.

A fuse element testing system is also provided. The system includes an integrated circuit test structure including a fuse element formed over a semiconductor substrate and a plurality of resistors formed adjacent to the fuse element, wherein a resistivity of the fuse element is temperature dependent. The system also includes means for monitoring a resistance change in the resistors to determine a heat dissipation behavior of the fuse element during triggering.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

In connection with FIGS. 1–4B, a method and system are provided for monitoring heat dissipation behavior of a fuse element formed in an integrated circuit (IC) structure during triggering thereof. Identifying the heat dissipation behavior of an old or new fuse element design enables the circuit designer to safely locate other circuit elements when the tested fuse design is incorporated into an actual, functional integrated circuit design. For example, the heat dissipation behavior can identify safe locations proximate to the fuse element where heat sensitive elements, such as metal resistors, well resistors and polysilicon resistors, can be located in the integrated circuit design.

Figure 1:
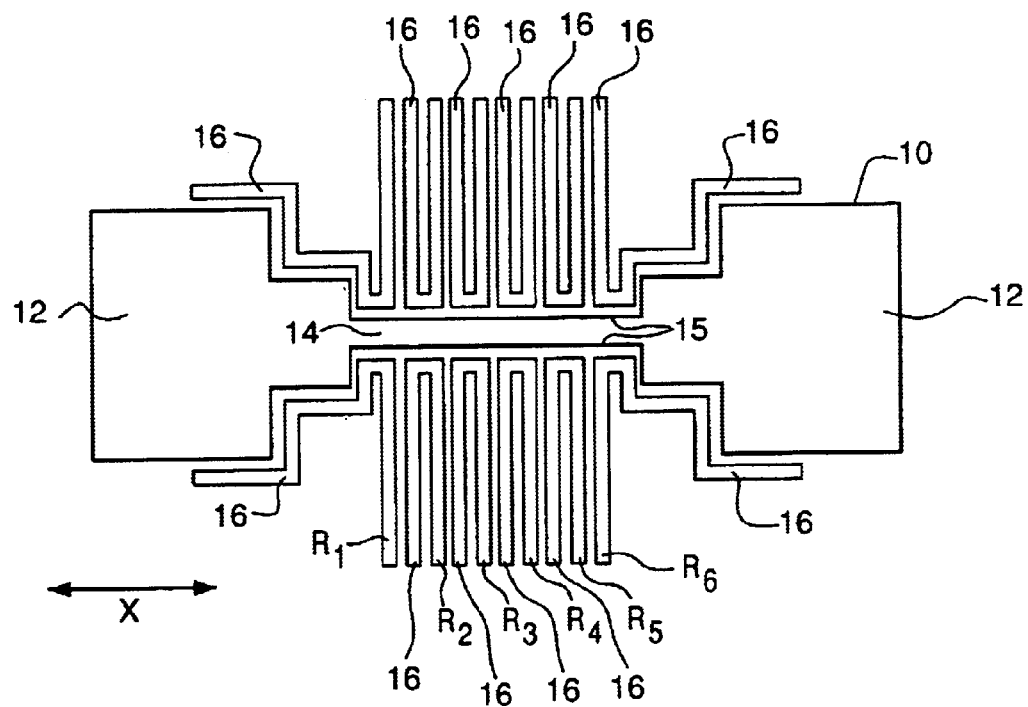
FIG. 1 is a top plan view of a first embodiment of a test structure having a fuse element and a plurality of sense resistors formed adjacent thereto.

FIG. 1 is a top plan view of a fuse element test structure formed in an integrated circuit. The test structure includes a fuse element 10, which is preferably a silicided or non-silicided polysilicon fuse element, as described in, for example, U.S. Pat. No. 6,242,790 to Tsui et al., the entirety of which is hereby incorporated by reference herein. The structure and operation of these polysilicon fuse elements are familiar to those in the IC fabrication art and are not repeated herein. Although described in connection with polysilicon fuse elements, it should be understood that the system and method described herein are not limited thereto and apply equally to other fuse elements known in the art and that may be developed that dissipate heat into a surrounding integrated circuit environment.

Fuse element 10 includes a pair of contact regions 12 and a body portion 14 disposed therebetween. A plurality of resistors are formed adjacent to the fuse element 10. Each resistor has a resistivity that is temperature dependent. In the embodiment of FIG. 1, a plurality of polysilicon resistors 16 arc formed adjacent lateral edges 15 of the body portion 14 of the fuse element 10. These resistors 16 are spaced along the lateral edges 15 so that each resistor has a portion thereof proximate to a respective portion of the body portion 14. In the embodiment of FIG. 1, the resistors 16 are preferably polysilicon resistors formed in the same plane or IC layer as the fuse element 10, thereby enabling a polysilicon element 10 and resistors 16 to be formed in the same process steps. Contacts to the resistors 16 may be silicided or non-silicided. The change in resistance of the polysilicon heat sensors is the result of the change in ambient temperature, since no programming voltage or current is applied to the polysilicon sensors.

A method of identifying the heat dissipation behavior of the fuse clement 10 is now described. Prior to triggering fuse element 10, the resistance of each resistor 16 is measured with general I–V measurements. For example, a voltage of about 0.1V is applied and the current is sensed with an appropriate tool, e.g. current meter, oscilloscope, or ohm meter to obtain the resistance value, or a low current of about 10–100 $\mu$A is applied and the voltage is sensed across the resistor with a voltage meter, oscilloscope or ohm meter to obtain resistance value. It should be apparent that, although not shown in the figures, contacts are made to the sensor resistors to allow for testing and monitoring of initial resistance and resistance change. After the initial resistance measurements are made, an appropriate voltage or current pulse (1 μs–1 ms) is applied to the fuse element 10 via contact regions 12 in order to trigger the fuse element 10 along body portion 14. The trigger voltage pulse is typically between about 1.5–5.0 volts. As the voltage or current is applied, the resistance of each resistor 16 is monitored using a measurement tool, such as an oscilloscope. During triggering, the fuse element dissipates heat into the integrated circuit structure. The resistance of a polysilicon resistor is temperature dependent and increases with temperature. Therefore, hot points can be identified by examining the change in resistance at each resistor 16.

The accumulated data may be examined by plotting the data in order to determine the heat dissipation behavior of the fuse element. For example, referring to FIG. 4A, the change in resistance ($\Delta R$) over original resistance ($R_O$) is plotted at a time $t_1$ during the triggering step against the positions of the various resistors 16 ($R_1$–$R_6$) spaced along a selected lateral edge of the body portion 14 of the fuse element 10. The change in resistance ($\Delta R$) over original resistance ($R_O$) is plotted in order to account for variations in original resistance between the various resistors $R_1$–$R_6$. As shown in FIG. 1, each resistor $R_1$–$R_6$ has a portion that is proximate to a different location of the body portion 16 for sensing heat dissipated from the fuse element 10.

Figure 4A:
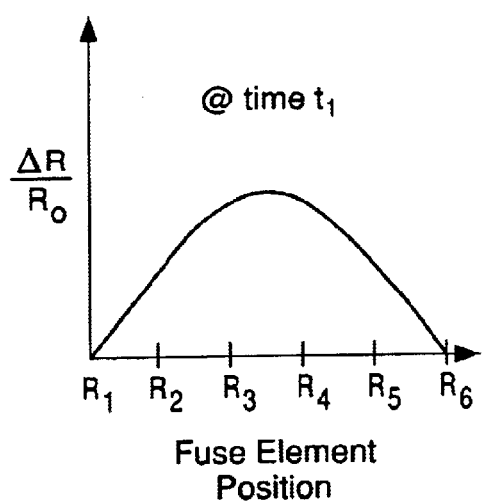
FIG. 4A is a plot of an expected resistance change against resistor position for the test structure embodiment of FIG. 1.
Figure 4B:
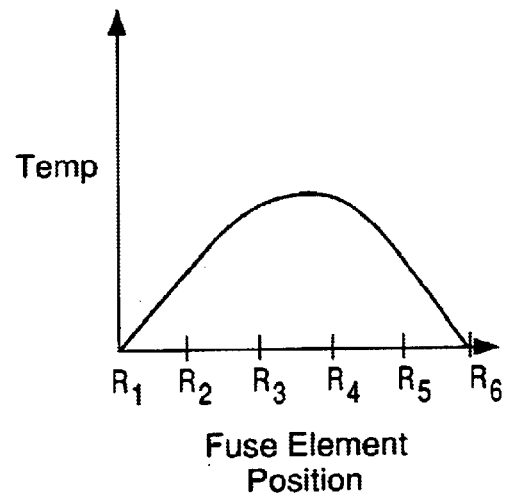
FIG. 4B is a plot of a temperature behavior of the test structure embodiment of FIG. 1 discerned form the resistance change plot of FIG. 4A.

It is expected that a symmetrical fuse element 10 as shown in FIG. 1 would have a symmetrical heat dissipation pattern along body portion 14 as shown in FIG. 4A. This may not be the case for non-symmetrical fuse elements. The methodology and system provide a particularly powerful means of determining the thermal dissipation behavior in the X direction of non-symmetrical elements. Because resistance is temperature dependent, the relative temperature at each resistor location along the body portion 14 may also be plotted as shown in FIG. 4B and corresponds with the plot of FIG. 4A. It may be assumed, without performing time consuming and costly SEM or TEM tests, that the fuse element "triggers" at the point of highest temperature.

Figure 2:
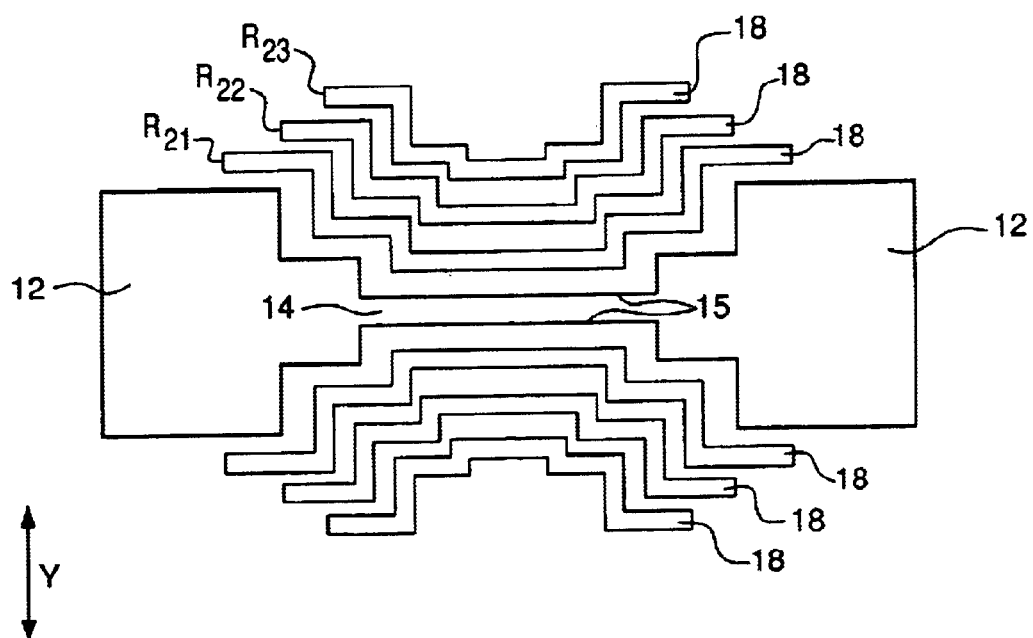
FIG. 2 is a top plan view of a second embodiment of a test structure having a fuse element and a plurality of sense resistors formed adjacent thereto.

Referring to FIG. 2, a top plan view is provided of a second embodiment of a fuse element test structure formed in an integrated circuit. The test structure again includes a fuse element 10 and a plurality of resistors formed adjacent to the fuse element 10. Each resistor has a resistivity that is temperature dependent. In the embodiment of FIG. 2, a plurality of polysilicon resistors 18 are formed at different respective locations spaced off or apart from the lateral edges 15 of body portion 14. This configuration allows for determination of the thermal dissipation of the behavior of the fuse element 10 by monitoring resistance changes in the resistors 18 as described above in connection with the embodiment of FIG. 1, albeit in the Y direction rather than the X direction.

One would expect that the sensed temperature would be greater in the resistors more proximate to the body portion (e.g., in $R_{21}$ and $R_{22}$ as compared to $R_{23}$) of a symmetrical fuse element 10 shown in FIG. 2. Monitoring the resistance changes, however, can reveal the relative temperature experienced at each location by a resistor 18. Further, the heat dissipation behavior of a non-symmetrical element is not so easily determined by merely viewing a schematic representation of the fuse element.

Figure 3:
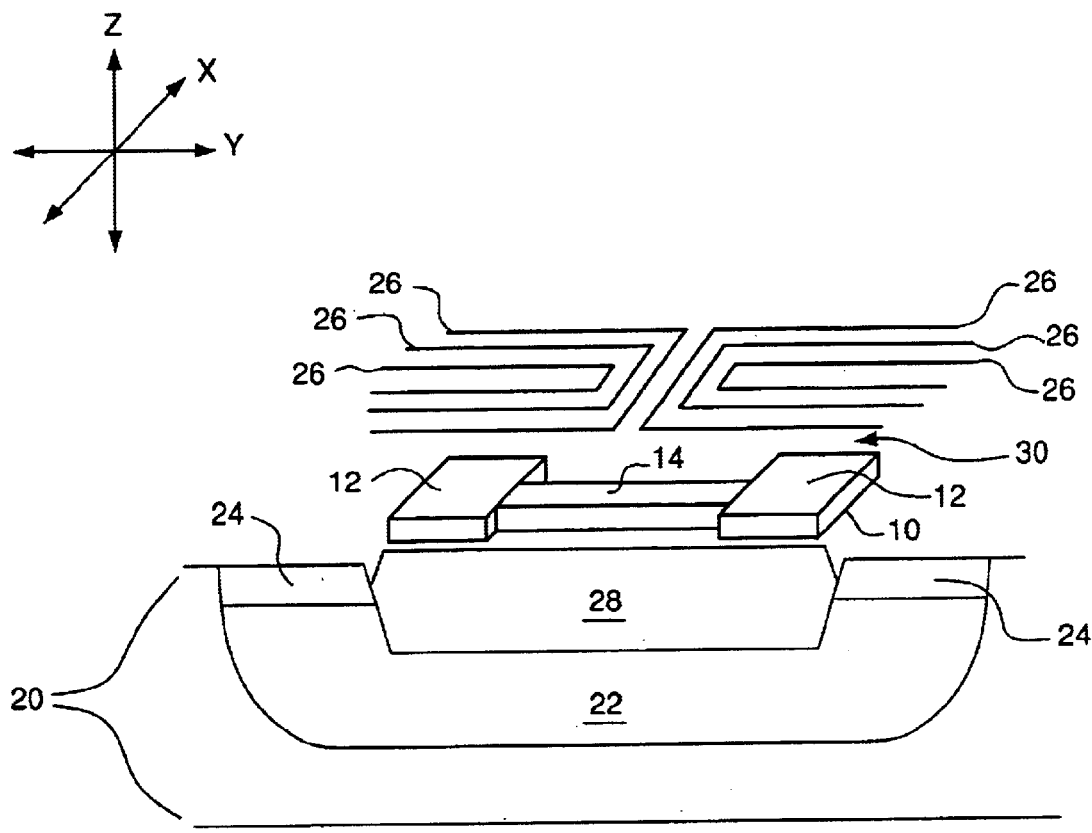
FIG. 3 is a partial perspective view of a third embodiment of a test structure having a fuse element and a plurality of sense resistors formed adjacent thereto.

Referring now to FIG. 3, a structure is illustrated that allows for the sensing of a heat dissipation behavior of the fuse element in the vertical Z direction, i.e., above and/or below the fuse element 10. In order to avoid overly complicating the figure, the bottom portion of FIG. 3 is illustrated as a cross-section view of the integrated circuit structure, and the top portion is illustrated in perspective.

The fuse element test structure includes a semiconductor substrate 20 including a field dielectric region, such as shallow trench isolation region 28 formed in the substrate 20. A fuse element 10 is formed over the isolation region 28. A N-type or P-type well region 22 is formed by appropriate ion implantation within the substrate 20 and may overlap N or P active regions 24. Although only one well resistor is shown, one or more resistors can be formed at different locations below the fuse. The resistance of well resistors increases with temperature. Therefore, heat diffusion downward to the substrata can be monitored.

A dielectric layer (shown generally as an insulation region 30) is formed over the fuse element 10. A plurality of resistors 26 are preferably formed over the fuse element 10 and over or within the insulating layer 30. The change in resistance of the resistors 26 may be monitored in the same manner described above in connection with the embodiments of FIGS. 1 and 2 in order to determine the heat dissipation behavior of the fuse element 10 during triggering thereof, albeit in the vertical Z direction rather than the horizontal X or Y direction.

In an exemplary embodiment, resistors 26 are metal resistors, such as aluminum or copper resistors. Utilizing metal resistors above a polysilicon fuse element 10, as opposed to polysilicon resistors, allows the present structure to be fabricated without introducing additional steps to the standard integrated circuit fabrication process, i.e., the metal resistors 26 can be formed as part of a standard metallization step. The resistance of metal resistors changes with ambient temperature due to the heat generated and diffused from the programming of the polysilicon fuse element. These changes can be monitored in real time by general I–V measurements using, for example, an oscilloscope By utilizing sensing resistors above a fuse element, below a fuse element, or adjacent the lateral edge or edges of a fuse element, a detailed understanding of the heat dissipation characteristics of a fuse element can be obtained. In testing an old or new fuse element design, the fuse element can be fabricated in an integrated circuit structure with all or one or a combination of different adjacent resistor patterns. For example, a fuse element may have a sensing well resistor formed below it, a resistor pattern shown in FIG. 1 adjacent one lateral edge, a resistor pattern shown in FIG. 2 adjacent a second lateral edge, and metal resistors formed above it. In this manner, the detected heat dissipation behavior can be determined from one fuse element. Alternatively, several identical fuse element can be fabricated at different locations in the integrated circuit. Each fuse element in that case can have a different sensing resistor pattern as shown in FIGS. 1–3 (or combination of patterns) formed adjacent thereto.

As mentioned above, once the heat dissipation behavior of a fuse element is identified, the behavior can be used to aid the circuit designer in locating heat sensitive elements within the integrated circuit with respect to the fuse element. For example, sensitive elements with low heat tolerances are not located proximate to hot spots identified from the heat dissipation behavior.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention

What is claimed is:

1. A method of monitoring heat dissipation behavior of a fuse element formed in an integrated circuit structure, comprising the steps of:

fabricating a fuse element in an integrated circuit structure;

forming a plurality of resistors adjacent said fuse element, wherein a resistivity of said resistors is temperature dependent;

triggering said fuse element, whereby heat is dissipated into said integrated circuit structure; and monitoring a resistance change in said resistors to determine the heat dissipation behavior of said fuse element during triggering.

2. The method of claim 1, wherein said fuse element is a polysilicon fuse element.

3. The method of claim 1, wherein said fuse element is a silicided polysilicon fuse element.

4. The method of claim 1, wherein said plurality of resistors include a plurality of polysilicon resistors.

5. The method of claim 1, wherein said fuse element includes a pair of contact regions and a body portion disposed therebetween, and wherein said plurality of resistors includes a plurality of resistors formed at respective locations spaced along at least one lateral edge of said body portion, said method further comprising the step of determining from said heat dissipation behavior a location along said body portion where said fuse element has been triggered.

6. The method of claim 5, wherein said resistors formed at said respective locations include polysilicon resistors.

7. The method of claim 1, wherein said fuse element includes a pair of contact regions and a body portion disposed therebetween, and wherein said plurality of resistors includes a plurality of resistors formed at respective locations spaced from at least one lateral edge of said body portion.

8. The method of claim 7, wherein said resistors formed at said respective locations include polysilicon resistors.

9. The method of claim 1, further comprising the step of forming an insulating layer over said fuse element, wherein said plurality of resistors include a plurality of resistors formed over said fuse element and over or within said insulating layer.

10. The method of claim 9, wherein said resistors formed over said fuse element include a plurality of metal resistors.

11. The method of claim 1, wherein said plurality of resistors includes at least one well resistor.

12. The method of claim 1, wherein said fuse element is a polysilicon fuse element including a pair of contact regions and a body portion disposed therebetween, and wherein said plurality of resistors includes a plurality of polysilicon resistors formed at respective locations spaced along at least one lateral edge of said body portion, and a plurality of polysilicon resistors formed at respective locations spaced from at least one lateral edge of said body portion said method further comprising the step of determining from said heat dissipation behavior a location along said body portion where said fuse element has been triggered.

13. A fuse element testing system, comprising:

an integrated circuit test structure, comprising:

a fuse element formed over a semiconductor substrate; and a plurality of resistors formed adjacent to said fuse element, wherein a resistivity of said fuse element is temperature dependent; and means for determining a heat dissipation behavior of said fuse element during triggering by monitoring a resistance change in said resistors.

14. The system of claim 13, wherein said fuse element is a polysilicon fuse element.

15. The system of claim 13, wherein said fuse element is a silicided polysilicon fuse element.

16. The system of claim 13, wherein said plurality of resistors include a plurality of polysilicon resistors.

17. The system of claim 13, wherein said fuse element includes a pair of contact regions and a body portion disposed therebetween, and wherein said plurality of resistors includes a plurality of resistors formed at respective locations spaced along at least one lateral edge of said body portion.

18. The system of claim 17, wherein said resistors formed at said respective locations include polysilicon resistors.

19. The system of claim 13, wherein said fuse element includes a pair of contact regions and a body portion disposed therebetween, and wherein said plurality of resistors includes a plurality of resistors formed at respective locations spaced from at least one lateral edge of said body portion.

20. The system of claim 13, wherein said resistors formed at said respective locations include polysilicon resistors.

21. The system of claim 13, further comprising an insulating layer formed over said fuse element, wherein said plurality of resistors includes a plurality of resistors formed over said fuse element and over or within said insulating layer.

22. The system of claim 19, wherein said resistors formed over said fuse element include metal resistors.

23. The system of claim 13, wherein said plurality of resistors includes at least one well resistor.

24. The system of claim 13, wherein said fuse element is a polysilicon fuse element including a pair of contact regions and a body portion disposed therebetween, and wherein said plurality of resistors includes a plurality of polysilicon resistors formed at respective locations spaced along at least one lateral edge of said body portion, and a plurality of polysilicon resistors formed at respective locations spaced from at least one lateral edge of said body portion.

25. A method of monitoring heat dissipation behavior of a fuse element formed in an integrated circuit structure, comprising the steps of:

fabricating a silicided polysilicon fuse element in an integrated circuit structure, said polysilicon fuse element including a pair of contacts and a body portion formed therebetween;

forming a plurality of resistors adjacent said fuse element, wherein a resistivity of said resistors is temperature dependent, said plurality of resistors including a plurality of resistors formed over said fuse element, a plurality of resistors formed proximate at least one lateral edge of said body portion, or a plurality of resistors formed below said fuse element or a combination thereof;

triggering said fuse element, whereby heat is dissipated into said integrated circuit structure; and monitoring a resistance change in said resistors to determine the heat dissipation behavior of said fuse element during triggering.

26. The method of claim 25, wherein said plurality of resistors includes a plurality of polysilicon resistors formed proximate to a lateral edge of said body portion and a plurality of metal resistors formed in or over an insulating layer formed over said fuse element.

* * * * *